United States Patent [19]
Brown et al.

[11] Patent Number: 5,437,189
[45] Date of Patent: Aug. 1, 1995

[54] DUAL ABSOLUTE PRESSURE SENSOR AND METHOD THEREOF

[75] Inventors: Clem H. Brown, Scottsdale; Daniel J. Wallace, Phoenix, both of Ariz.

[73] Assignee: Motorola, Inc., Schaumburg, Ill.

[21] Appl. No.: 237,527

[22] Filed: May 3, 1994

[51] Int. Cl.⁶ .............................................. G01L 9/06
[52] U.S. Cl. ........................................ 73/721; 73/717; 73/708
[58] Field of Search ................. 73/720, 721, 726, 727, 73/708

[56] References Cited

U.S. PATENT DOCUMENTS

| | | | |
|---|---|---|---|
| 4,287,501 | 9/1981 | Tominaga et al. | 73/720 |
| 4,499,774 | 2/1985 | Tsuchiya et al. | 73/727 |
| 4,528,855 | 7/1985 | Singh | 73/721 |
| 4,658,651 | 4/1987 | Le | 73/708 |
| 4,771,639 | 9/1988 | Saigusa et al. | 73/727 |
| 5,193,394 | 3/1993 | Suda | 73/766 |

FOREIGN PATENT DOCUMENTS

| | | | |
|---|---|---|---|
| 500945 | 9/1992 | European Pat. Off. | 73/708 |
| 00281457 | 8/1990 | Germany | 73/727 |
| 2207804 | 2/1989 | United Kingdom | 73/727 |

Primary Examiner—Robert Raevis
Assistant Examiner—Richard A. Moller
Attorney, Agent, or Firm—Robert D. Atkins

[57] ABSTRACT

A dual absolute pressure sensor independently converts first and second external pressures to first and second electrical signals respectively. A package body has first and second openings for receiving the first and second external pressures to outside surfaces of first and second sensor die attached to opposite surfaces of an internal glass substrate that separates the first and second openings. The first sensor die includes a first cavity having a reference pressure to measure against the first external pressure and develop a first differential pressure. A first piezoelectric network converts the first differential pressure to the first electrical signal representative of that pressure. The second sensor die includes a second cavity having a reference pressure to independently measure against the second external pressure and develop a second differential pressure. A second piezoelectric network converts the second differential pressure to the second electrical signal representative of that pressure.

19 Claims, 1 Drawing Sheet

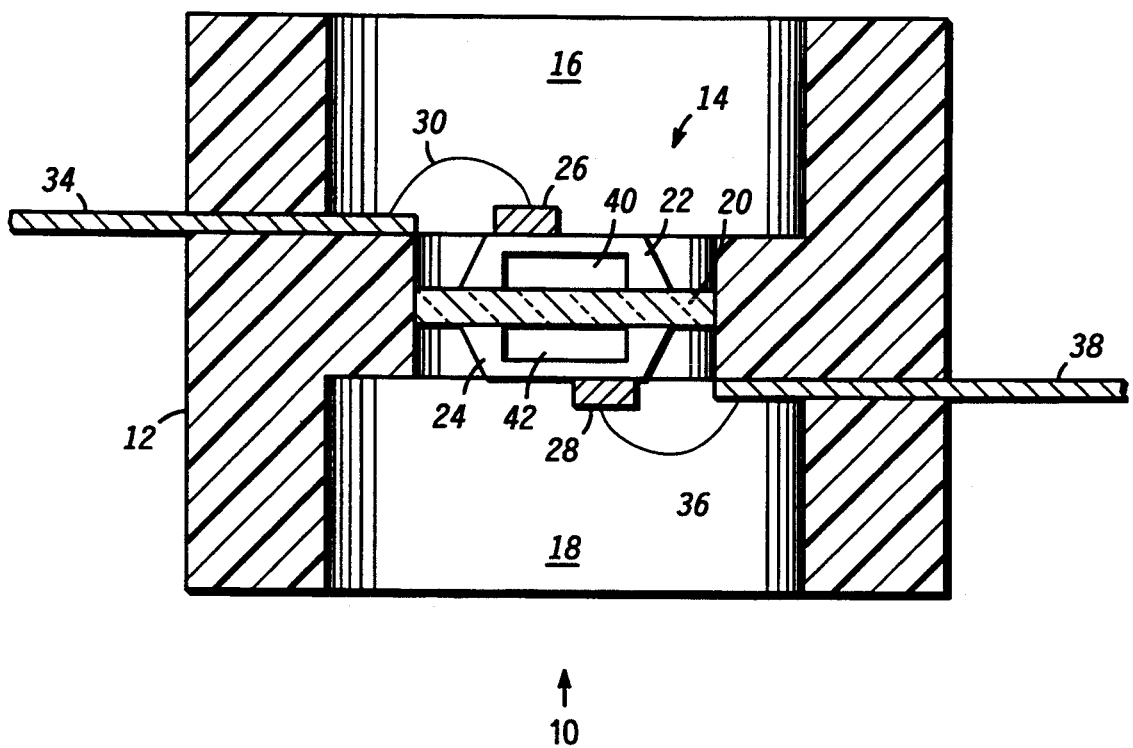

DUAL ABSOLUTE PRESSURE SENSOR AND METHOD THEREOF

BACKGROUND OF THE INVENTION

The present invention relates in general to pressure sensors and, more particularly, to an electronic absolute pressure sensor.

Electronic pressure sensors are commonly used to convert gaseous or liquid pressure to an electrical signal representative of that pressure. Typical applications include intake manifold pressure sensing for automotive engines, dual braking system pressure sensing, air conditioning high/low pressure line sensing, pressure regulation of compressed gases in industrial environments, and altimeter/cabin pressure sensing and regulation for aerospace applications.

The pressure sensor measures external pressure against some reference pressure. Gauge-type pressure sensors measure pressure against an external dynamic reference and provide a difference reading. Absolute-type pressure sensors compare the external pressure to be measured against a static internal reference to provide the difference reading. The absolute pressure reference is typically a very low pressure, or near vacuum, say 20 millitorr. The low pressure reference allows comparisons to be made accurately from above standard barometric pressures to nearly vacuum.

Pressure sensors typically include a sensor die having a piezoelectric network mounted on a silicon diaphragm that flexes in response to the differential pressure. The sensor die converts the degree of flexing to an electrical signal. In the prior art, one sensor die is mounted in one plastic package. Unfortunately, the sensor package tends to be quite large in comparison to the sensor semiconductor die that performs the actual pressure sensing function. Moreover, the sensor packaging accounts for a large percentage of total manufacturing costs.

Hence, a need exists to make the most efficient use of pressure sensor packaging with respect to the pressure sensing function.

BRIEF DESCRIPTION OF THE DRAWING

The sole FIGURE illustrates a cross-sectional view of a dual absolute pressure sensor.

DETAILED DESCRIPTION OF THE PREFERRED EMBODIMENT

Referring to the sole figure, a cross-sectional view of an electronic pressure sensor 10 is shown. Pressure sensor 10 converts gaseous or liquid pressure to an electrical signal representative of that pressure. Pressure sensor 10 comprises dual absolute pressure sensors to independently measure first and second externally applied pressures against first and second static internal reference pressures to provide respective individual pressure readings. The dual absolute pressure sensors operate independently while sharing a common glass substrate and package body to save manufacturing costs.

Pressure sensor 10 includes package body 12 housing transducer substrate assembly 14. Package body 12 includes openings 16 and 18 allowing first and second external pressures to reach opposite sides of transducer substrate assembly 14. Package body 12 is molded from a novalac epoxy and provides a housing and electrical interconnect for transducer substrate assembly 14. Other potential materials for package body 12 include organic epoxies, elastomers filled with inorganic matter, and ceramic that provide polar and non-polar chemical resistance.

Transducer substrate assembly 14 includes glass substrate 20 attached to package body 12 with a bonding agent to isolate opening 16 from opening 18. Glass substrate 20 has non-porosity characteristics to maintain the seal between openings 16 and 18. Glass substrate 20 is made from materials such as borosilicate glass, various grades and compositions of alumina, cordierite, and steatite, that provides stress isolation by having a similar coefficient of thermal expansion as sensor die 22 and 24. Sensor die 22 and sensor die 24 are made of silicon and attached to opposite sides of glass substrate 20. A first transducer diaphragm is formed in sensor die 22 by etching silicon away from the back side in a square pattern until a thin, approximately one mil, diaphragm remains. Sensor die 22 may also be micro-machined to form the transducer diaphragm.

A piezoelectric pressure sensing network 26 is formed as an integral part of sensor die 22 to sense flexing of the first transducer diaphragm and produce an electrical signal in response thereto. Piezoelectric network 26 comprises an implanted transducer, thin-film deposited resistors, evaporated metallization, and aluminum evaporated bond pads. The transducer, resistors, and bond pads are interconnected using the aluminum metallization. The function of piezoelectric network 26 is to sense the flexing of the transducer diaphragm and provide a variable resistance path as a function of the applied differential pressure for the direct current induced by a voltage applied between two of the package body leads.

A second transducer diaphragm is formed in sensor die 24 by etching silicon away from the back side in a square pattern until a thin, approximately one mil, diaphragm remains. Sensor die 24 may also be micromachined to form the transducer diaphragm. A piezoelectric pressure sensing network 28 is formed as an integral part of sensor die 24 to sense flexing Of the second transducer diaphragm and produce an electrical signal in response thereto as described above for sensor die 22.

To form transducer substrate assembly 14, sensor die 22 and 24 are attached to opposite sides glass substrate 20 with a bonding agent such as glass or metal filled glass having a similar coefficient of thermal expansion as glass substrates 20 and sensor die 22 and 24. The glass bonding agent also has non-porosity characteristics to preserve the seal between openings 16 and 18. The bonding agent is applied as a thin film either to the sensor die mounting surface, or to the glass substrate surface, or to both surfaces. A seal between glass substrate 20 and sensor die 22 and 24 is achieved by firing or reflowing the bonding glass at 400° C. or more to bond sensor die 22 and 24 to glass substrate 20. The sealing is performed in a partial vacuum to establish dual identical absolute reference pressures of 20 millitorr in cavities 40 and 42. During the sealing process, cavities 40 and 42 are formed between the first and second transducer diaphragms and glass substrate 20 with first and second absolute reference pressures sealed inside.

The dual individual absolute pressure sensor has the advantage absolute temperature compensation as sensor die 22 and 24 are referenced by common glass substrate 20. That is, the common glass substrate 20 provides a common temperature to cavities 40 and 42 and sensor die 22 and 24. The common temperature increases sensing accuracy relative, to both pressure sensors since each are exposed to the same temperature. Moreover, the dual pressure references have identical pressures, i.e. 20 millitorr, but are not common. The low pressure reference allows precision measurements to be made and compared to one another in two different environments simultaneously from above standard barometric pressures to nearly vacuum.

Transducer substrate assembly 14 is attached to package body 12 using a semi-rigid adhesive bonding agent such as epoxy. Bonding wire 30 interconnects piezoelectric network 26 with copper package lead 34. In one embodiment, a total of four package leads with associated bondwires are connected to piezoelectric network 26; two for power supply potentials and two for tap points along the piezoelectric network to measure a potential difference developed in response to current flowing through the resistive piezoelectric network. Additional package leads and associated bondwires (not shown) may be added for custom tap points into piezoelectric network 26.

In a similar manner, bonding wire 36 interconnects piezoelectric network 28 witch copper package lead 38. In one embodiment, a total of four package leads with associated bondwires are connected to piezoelectric network 28; two for power supply potentials and two for tap points along the piezoelectric network to measure a potential difference developed in response to current flowing through the resistive piezoelectric network. Additional package leads and associated bondwires (not shown) may be added for custom tap points into piezoelectric network 28. The bondwires are preferably made of gold and attached to aluminum bonding pads on the underside of the sensor die using conventional integrated circuit bonding techniques.

As part of the present invention, dual absolute pressure sensors, i.e. sensor die 22 and 24, are provided in the same package body 12. Sensor die 22 operates independent of sensor die 24. Sensor die 22 has its own reference pressure sealed within cavity 40 to compare against the first external pressures applied through opening 16 to an outside surface of the transducer diaphragm of sensor die 22. The transducer diaphragm of sensor die 22 flexes upon application of a differential pressure between a fluid or gas entering opening 16 and the absolute reference pressure sealed in cavity 40. The differential pressure causes a change in the resistance film of piezoelectric network 26 and results in a corresponding change in the current flow in the respective resistor. Current tap points or electrical connections are made along the resistive path of piezoelectric network 26. The electrical connections are defined at the juncture of the attachment point of the bondwires and sensor die 22 at conventional bond pads. The change in current flow appears as a potential difference on current taps of piezoelectric network 26. The current taps are electrically coupled via the bondwires to electrical package body leads, respectively. Thus, piezoelectric network 26 measures the differential pressure between the reference pressure in cavity 40 and the first external pressure applied through opening 16 and provides an electrical signal representative of that differential pressure through bondwire 30 and package lead 34 for transmission to other receiving circuitry for evaluation (not shown).

For independent sensing operation, sensor die 24 has its own reference pressure sealed within cavity 42 to compare against the second external pressures applied through opening 18 to an outside surface of the transducer diaphragm of sensor die 24. The transducer diaphragm of sensor die 24 flexes upon application of a differential pressure between a fluid or gas entering opening 18 and the absolute reference pressure sealed in cavity 42. The differential pressure causes a change in the resistance film of piezoelectric network 28 and results in a corresponding change in the current flow in the respective resistor as described above to generate an electrical signal representative of the differential pressure.

By now it should be appreciated that dual absolute pressure sensors are included in the same package body each with individual reference pressures to allow independent sensing by the transducer diaphragm of each sensor die. The present invention allows one standard size pressure sensor package to independently measure two external pressures in contrast to the prior art that requires two discrete packages to absolutely measure two external pressures. The single package in the present invention including two absolute pressure sensors has an advantage in cost and complexity when compared to using two discrete sensor packages. The dual low pressure absolute references allow precision measurements to be made and compared to one another in two different environments simultaneously from above standard barometric pressures to nearly vacuum. In addition, the common glass substrate separating the sensor die provides a common temperature that increases sensing accuracy by providing automatic temperature compensation.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A dual absolute pressure sensor, comprising:
    a glass substrate having first and second surfaces wherein said glass substrate distribute a common temperature to said first and second surfaces for increased accuracy of the dual absolute pressure sensor;
    a first sensor die attached to said first surface of said glass substrate to form a first cavity having a first reference pressure, said first sensor die measuring a first differential pressure between said first reference pressure and an outside surface of said first sensor die at which is applied a first external pressure for providing a first electrical signal representative of said first differential pressure and
    a second sensor die attached to said second surface of said glass substrate to form a second cavity having a second reference pressure, said second sensor die measuring a second differential pressure between said second reference pressure and an outside surface of said second sensor die at which is applied a second external pressure for providing a second electrical signal representative of said second differential pressure.

2. The dual absolute pressure sensor of claim 1 wherein said first sensor die includes a first diaphragm separating said first reference pressure and said first external pressure, said first diaphragm flexing in response to said first differential pressure between said first cavity and said outside surface of said first sensor die.

3. The dual absolute pressure sensor of claim 2 wherein said first sensor die further including a first piezoelectric network for measuring said first differential pressure between said first reference pressure and said first external pressure and providing said first electrical signal representative of said first differential pressure.

4. The dual absolute pressure sensor of claim 3 wherein said second sensor die includes a second diaphragm separating said second reference pressure and said second external pressure, said second diaphragm flexing in response to said second differential pressure between said second cavity and said outside surface of said second sensor die.

5. The dual absolute pressure sensor of claim 4 wherein said second sensor die further including a second piezoelectric network for measuring said second differential pressure between said second reference pressure and said second external pressure and providing said second electrical signal representative of said second differential pressure.

6. The dual absolute pressure sensor of claim 5 further including a package body for housing said glass substrate with said first and second sensor die, said package body including first and second openings for receiving said first and second external pressures to said outside surfaces of said first and second sensor die respectively.

7. The dual absolute pressure sensor of claim 6 wherein said package body includes:
a first bondwire having a first end coupled to said first piezoelectric network for receiving said first electrical signal; and
a first lead coupled to a second end of said first bondwire for transmitting said first electrical signal.

8. The dual absolute pressure sensor of claim 7 wherein said package body further includes:
a second bondwire having a first end coupled to said second piezoelectric network for receiving said second electrical signal; and
a second lead coupled to a second end of said second bondwire to transmitting said second electrical signal.

9. A method of sensing first and second external pressures, comprising the steps of:
providing a glass substrate having first and second surfaces where said glass substrate distributes a common temperature to said first and second surfaces for increased accuracy in reading the first and second external pressures;
attaching a first sensor die to said first surface of said glass substrate to form a first cavity having a first reference pressure where said first sensor die measures a first differential pressure between said first reference pressure and an outside surface of said first sensor die at which is applied a first external pressure for providing a first electrical signal representative of said first differential pressure; and
attaching a second sensor die to said second surface of said glass substrate to form a second cavity having a second reference pressure such that said second sensor die measures a second differential pressure between said second reference pressure and an outside surface of said second sensor die at which is applied a second external pressure for providing a second electrical signal representative of said second differential pressure.

10. The method of claim 9 further including the step of separating said first reference pressure and said first external pressure with a first diaphragm that flexes in response to said first differential pressure between said first cavity and said outside surface of said first sensor die.

11. The method of claim 10 further including the step of measuring said first differential pressure between said first reference pressure and said first external pressure with a first piezoelectric network and providing said first electrical signal representative of said first differential pressure.

12. The method of claim 11 further including the step of separating said second reference pressure and said second external pressure with a second diaphragm that flexes in response to said second differential pressure between said second cavity and said outside surface of said second sensor die.

13. The method of claim 12 further including the step of measuring said second differential pressure between said second reference pressure and said second external pressure with a second piezoelectric network and providing said second electrical signal representative of said second differential pressure.

14. The method of claim 13 further including the step of housing said glass substrate with said first and second sensor die in a package body that includes first and second openings for receiving said first and second external pressures to said outside surfaces of said first and second sensor die respectively.

15. A dual absolute pressure sensor, comprising:
a glass substrate having first and second surfaces wherein said glass substrate distributes a common temperature to said first and second surfaces for increased accuracy of the dual absolute pressure sensor;
a first sensor die attached to said first surface of said glass substrate to form a first cavity having a first reference pressure, said first sensor die measuring a first differential pressure between said first reference pressure and an outside surface of said first sensor die at which is applied a first external pressure for providing a first electrical signal representative of said first differential pressure;
a second sensor die attached to said second surface of said glass substrate to form a second cavity having a second reference pressure, said second sensor die measuring a second differential pressure between said second reference pressure and an outside surface of said second sensor die at which is applied a second external pressure for providing a first electrical signal representative of said second differential pressure; and
a package body for housing said glass substrate with said first and second sensor die, said package body including first and second openings for receiving said first and second external pressures to said outside surfaces of said first and second sensor die respectively.

16. The dual absolute pressure sensor of claim 15 wherein said first sensor die includes:
a first diaphragm separating said first reference pressure and said first external pressure, said first diaphragm flexing in response to said first differential pressure between said first cavity and said outside surface of said first sensor die; and a first piezoelectric network for measuring said first differential pressure between said first reference pressure and said first external pressure and providing said first electrical signal representative of said first differential pressure.

17. The dual absolute pressure sensor of claim 16 wherein said second sensor die includes:

a second diaphragm separating said second reference pressure and said second external pressure, said second diaphragm flexing in response to said second differential pressure between said second cavity and said outside surface of said second sensor die; and a second piezoelectric network for measuring said second differential pressure between said second reference pressure and said second external pressure and providing said second electrical signal representative of said second differential pressure.

18. The dual absolute pressure sensor of claim 17 wherein said package body includes:

a first bondwire having a first end coupled to said first piezoelectric network for receiving said first electrical signal; and a first lead coupled to a second end of said first bondwire to transmitting said first electrical signal.

19. The dual absolute pressure sensor of claim 18 wherein said package body further includes:

a second bondwire having a first end coupled to said second piezoelectric network for receiving said second electrical signal; and a second lead coupled to a second end of said second bondwire to transmitting said second electrical signal.

\* \* \* \* \*